(12) United States Patent
Takata

(10) Patent No.: US 10,141,384 B2
(45) Date of Patent: Nov. 27, 2018

(54) ORGANIC ELECTROLUMINESCENT PANEL AND LUMINESCENT UNIT

(71) Applicant: JOLED INC., Tokyo (JP)

(72) Inventor: Masakazu Takata, Tokyo (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 15/889,631

(22) Filed: Feb. 6, 2018

(65) Prior Publication Data
US 2018/0233548 A1 Aug. 16, 2018

(30) Foreign Application Priority Data

Feb. 13, 2017 (JP) ................................. 2017-024226

(51) Int. Cl.
| | |
|---|---|
| *H01L 29/08* | (2006.01) |
| *H01L 27/32* | (2006.01) |
| *H01L 51/56* | (2006.01) |
| *H01L 51/00* | (2006.01) |
| *H01L 51/50* | (2006.01) |
| *G09G 3/3225* | (2016.01) |
| *G09G 3/3266* | (2016.01) |

(52) U.S. Cl.
CPC ...... *H01L 27/3246* (2013.01); *H01L 27/3218* (2013.01); *H01L 51/0005* (2013.01); *H01L 51/56* (2013.01); *G09G 3/3225* (2013.01); *G09G 3/3266* (2013.01); *G09G 2310/08* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2227/323* (2013.01)

(58) Field of Classification Search
CPC .................................................. H01L 27/3246
USPC ............................................................. 257/40
See application file for complete search history.

(56) References Cited

U.S. PATENT DOCUMENTS

2016/0133677 A1  5/2016 Yamamoto et al.
2017/0133443 A1* 5/2017 Nendai ............... H01L 27/3246

FOREIGN PATENT DOCUMENTS

| JP | 2013-214359 A | 10/2013 |
|---|---|---|
| JP | 2016-091841 A | 5/2016 |

* cited by examiner

*Primary Examiner* — Ajay K Arora
(74) *Attorney, Agent, or Firm* — K&L Gates LLP

(57) ABSTRACT

An organic electroluminescent panel includes a plurality of pixels and a plurality of banks. The pixels each include a plurality of subpixels. The subpixels each include an organic electroluminescent element that includes a first electrode, a second electrode, and an organic material layer that is provided between the first electrode and the second electrode. The banks define each of the subpixels in each of the pixels. The organic electroluminescent element in each of the subpixels is provided in a gap between adjacent two of the banks, and the following relational expression is satisfied:

$$y \leq 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

8 Claims, 6 Drawing Sheets

$$\text{APERTURE RATIO } R = \frac{W2}{W1} \times 100 \ [\%]$$

APERTURE RATIO $R = \dfrac{W2}{W1} \times 100$ [%]

R ≥ 70%

$$y \leq 0.0001714 \, x^2 + 0.0151429 \, x + 0.2914286$$

R ≥ 80%

$$y \leq 0.0000762 \, x^2 + 0.0100952 \, x + 0.2914286$$

R ≥ 90%

$$y \leq 0.0000190 \, x^2 + 0.0050476 \, x + 0.2914286$$

ORGANIC ELECTROLUMINESCENT PANEL AND LUMINESCENT UNIT

CROSS REFERENCE TO RELATED APPLICATIONS

This application claims the benefit of Japanese Priority Patent Application JP2017-024226 filed Feb. 13, 2017, the entire contents of which are incorporated herein by reference.

BACKGROUND

The disclosure relates to an organic electroluminescent panel and a luminescent unit.

There is known a method of manufacturing an organic electroluminescent panel by forming an organic electroluminescent element for each pixel with use of an ink jet device. A recent increase in definition has brought a reduction in pixel size and a reduction of a liquid amount to be retained per unit area. From the standpoint of solubility or a printable physical property such as viscosity, however, it is difficult to excessively increase an ink concentration. For this reason, it can be considered to ensure the wet-spreading property of ink by, for example, making the side of a bank that defines each pixel lyophilic even when the liquid retention amount is small. Note that the bank that defines each pixel is described in, for example, Japanese Unexamined Patent Application Publication No. 2016-91841 and No. 2013-214359.

SUMMARY

In a case where a side of a bank is made lyophilic, however, a meniscus is formed on an ink surface in a process of drying ink. The meniscus is also formed on a surface of a film after the drying of the ink. This makes a bank vicinity extremely thick in the thus-formed film, resulting in a phenomenon in which a center part of a pixel emits light strongly. As a result, a part that is usable as a light-emitting part is reduced.

It is desired to provide an organic electroluminescent panel and a luminescent unit that make it possible to suppress a reduction of a part usable as a light-emitting part.

An organic electroluminescent panel according to an embodiment of the disclosure includes: a plurality of pixels each including a plurality of subpixels, in which the subpixels each include an organic electroluminescent element, and the organic electroluminescent element includes a first electrode, a second electrode, and an organic material layer that is provided between the first electrode and the second electrode; and a plurality of banks that define each of the subpixels in each of the pixels. The organic electroluminescent element in each of the subpixels is provided in a gap between adjacent two of the plurality of banks, and the following relational expression is satisfied:

$$y \leq 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

A luminescent unit according to an embodiment of the disclosure includes: an organic electroluminescent panel; and a driver. The organic electroluminescent panel includes: a plurality of pixels driven by the driver and each including a plurality of subpixels, in which the subpixels each include an organic electroluminescent element, and the organic electroluminescent element including a first electrode, a second electrode, and an organic material layer that is provided between the first electrode and the second electrode; and a plurality of banks that define each of the subpixels in each of the pixels. The organic electroluminescent element in each of the subpixels is provided in a gap between adjacent two of the plurality of banks, and the following relational expression is satisfied:

$$y \leq 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

DETAILED DESCRIPTION

Figure 1:
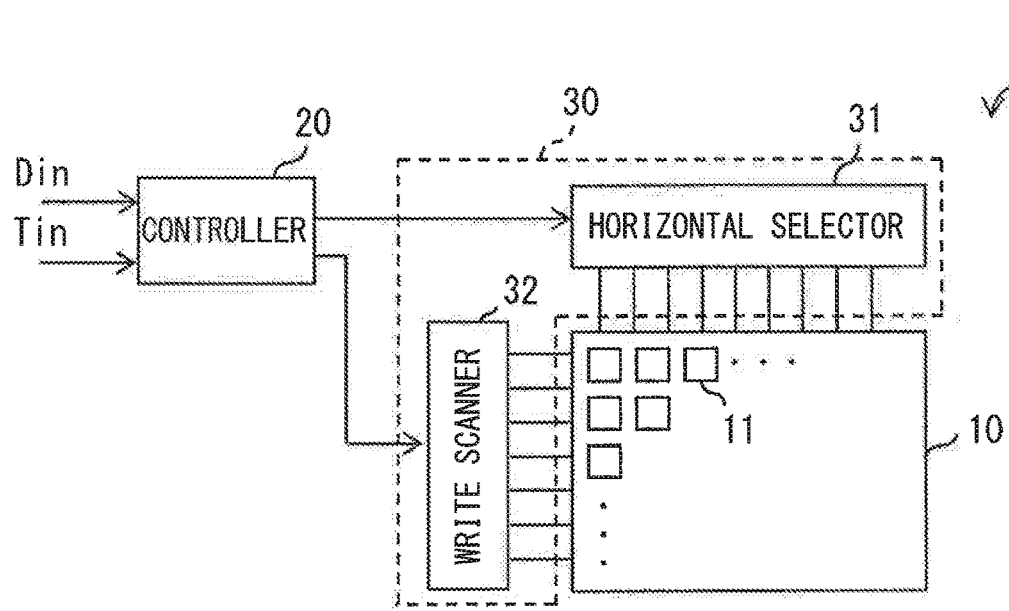
FIG. 1 illustrates a schematic configuration example of an organic electroluminescent unit according to an embodiment of the disclosure.

In the following, some example embodiments of the disclosure are described in detail, in the following order, with reference to the accompanying drawings. Note that the following description is directed to illustrative examples of the disclosure and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail.

Embodiments

[Configuration]

Figure 2:
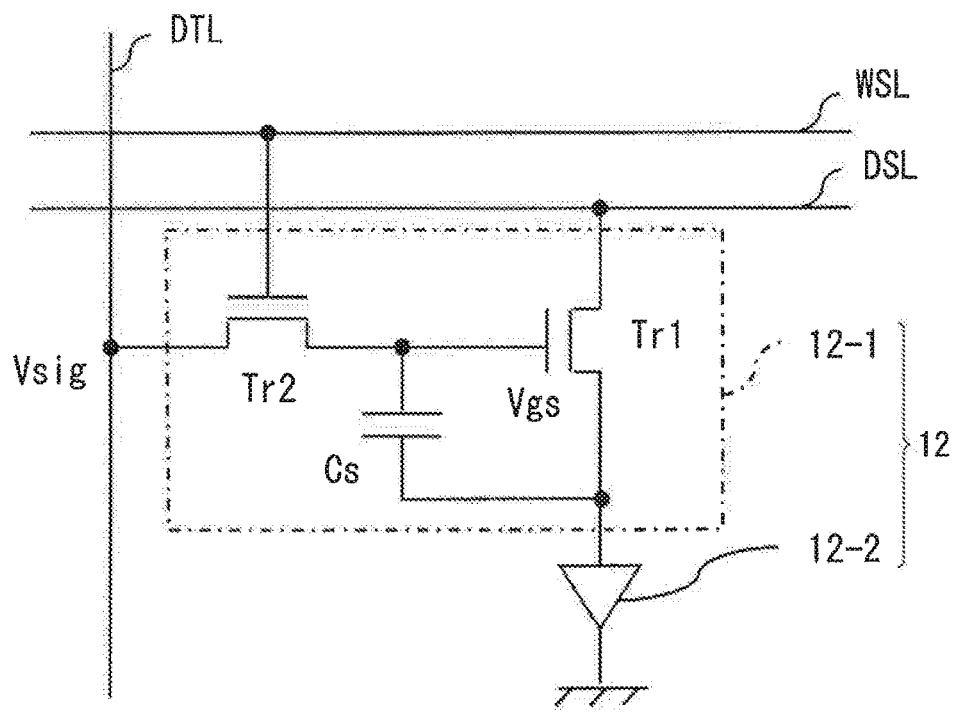
FIG. 2 illustrates a circuit configuration example of a subpixel included in each pixel of FIG. 1.

FIG. 1 illustrates a schematic configuration example of an organic electroluminescent unit 1 according to an embodiment of the disclosure. FIG. 2 illustrates an example of a circuit configuration of a subpixel 12 included in each pixel 11 that is provided in the organic electroluminescent unit 1. The organic electroluminescent unit 1 may include an organic electroluminescent panel 10, a controller 20, and a driver 30, for example. The driver 30 may be implemented on an outer edge of the organic electroluminescent panel 10. The organic electroluminescent panel 10 may have a plurality of pixels 11 disposed in matrix. The controller 20 and the driver 30 may drive the organic electroluminescent panel 10, i.e., drive the plurality of pixels 11, on the basis of an image signal Din and a synchronization signal Tin. The image signal Din and the synchronization signal Tin may be inputted from outside.

(Organic Electroluminescent Panel 10)

Each of the pixels 11 may be active-matrix-driven by the controller 20 and the driver 30. Thereby, the organic electroluminescent panel 10 may display an image based on the image signal Din and the synchronization signal Tin that are inputted from the outside. The organic electroluminescent panel 10 may have a plurality of scan lines WSLs extending in a row direction, a plurality of signal lines DTLs and a plurality of power lines DSLs both extending in a column direction, and the plurality of pixels 11 that are disposed in matrix.

The scan lines WSLs may be used to select the respective pixels 11. The scan lines WSL may supply the respective pixels 11 with a selection pulse that selects the pixels 11 on a predetermined unit basis, such as a pixel row basis, for example. The signal lines DTLs may be used to supply a signal voltage Vsig to the respective pixels 11. The signal voltage Vsig may be based on the image signal Din. The signal lines DTLs may supply a data pulse including the signal voltage Vsig to the respective pixels 11. The power lines DSLs may supply electric power to the respective pixels 11.

Each of the pixels 11 may include a subpixel 12 that emits red light, a subpixel 12 that emits green light, and a subpixel 12 that emits blue light, for example. Furthermore, each of the pixels 11 may also include a subpixel 12 that emits light of any other color, which may be white or yellow, for example. In each of the pixels 11, the subpixels 12 may be arranged in a line in a predetermined direction, for example.

Each of the signal lines DTLs may be coupled to an output end of a horizontal selector 31 to be described later. The signal lines DTLs, for example, may be each assigned to corresponding one of pixel columns. Each of the scan lines WSLs may be coupled to an output end of a write scanner 32 to be described later. The scan lines WSLs, for example, may be each assigned to corresponding one of pixel rows. Each of the power lines DSLs may be coupled to an output end of a power supply. The power lines DSLs, for example, may be each assigned to corresponding one of the pixel rows.

Each of the subpixels 12 may have a pixel circuit 12-1 and an organic electroluminescent element 12-2. A configuration of the organic electroluminescent element 12-2 is described later in detail.

The pixel circuit 12-1 may control light emission and light extinction of the organic electroluminescent element 12-2. The pixel circuit 12-1 may hold a voltage written into corresponding one of the subpixels 12 through write scan. The write scan is described later. The pixel circuit 12-1 may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may correspond to the image signal Din. For example, the switching transistor Tr2 may perform sampling of a voltage of the signal line DTL and write the voltage obtained through the sampling to the gate of the driving transistor Tr1. The driving transistor Tr1 may be coupled in series to the organic electroluminescent element 12-2. The driving transistor Tr1 may drive the organic electroluminescent element 12-2. The driving transistor Tr1 may control an electric current flowing through the organic electroluminescent element 12-2 in accordance with a magnitude of the voltage sampled by the switching transistor Tr2. The storage capacitor Cs may store a predetermined voltage between a gate and a source of the driving transistor Tr1. The storage capacitor Cs may keep a gate-source voltage Vgs of the driving transistor Tr1 constant for a predetermined period of time. Note that the pixel circuit 12-1 may have a circuit configuration in which various capacitors or transistors are added to a circuit of 2Tr1C described above. Alternatively, the pixel circuit 12-1 may have a different circuit configuration from the circuit configuration of the 2Tr1C described above.

Each of the signal lines DTLs may be coupled to an output end of the horizontal selector 31 and to a source or a drain of the switching transistor Tr2. The horizontal selector 31 is described later. Each of the scan lines WSLs may be coupled to the output end of the write scanner 32 and to a gate of the switching transistor Tr2. The write scanner 32 is described below. Each of the power lines DSLs may be coupled to a power circuit and the source or a drain of the driving transistor Tr1.

The gate of the switching transistor Tr2 may be coupled to the scan line WSL. The source or the drain of the switching transistor Tr2 may be coupled to the signal line DTL. Of the source and the drain of the switching transistor Tr2, a terminal not coupled to the signal line DTL may be coupled to the gate of the driving transistor Tr1. The source or the drain of the driving transistor Tr1 may be coupled to the power line DSL. Of the source and the drain of the driving transistor Tr1, a terminal not coupled to the power line DSL may be coupled to an anode 21 of the organic electroluminescent element 12-2. One end of the storage capacitor Cs may be coupled to the gate of the driving transistor Tr1. Other end of the storage capacitor Cs may be coupled to a terminal on the side of the organic electroluminescent element 12-2 of the source and the drain of the driving transistor Tr1.

(Driver 30)

The driver 30 may have the horizontal selector 31 and the write scanner 32, for example. In response to, or in synchronization with, input of a control signal, for example, the horizontal selector 31 may apply the analog signal voltage Vsig to each of the signal lines DTLs. The analog signal voltage Vsig may be inputted from the controller 20. The write scanner 32 may scan the plurality of subpixels 12 on a predetermined unit basis.

(Controller 20)

The controller 20 is described in the following. The controller 20 may perform a predetermined correction on the digital image signal Din and generate the signal voltage Vsig on the basis of the thus-obtained image signal. The image signal Din may be inputted from the outside, for example. The controller 20 may output the generated signal voltage Vsig to the horizontal selector 31, for example. In response to, or in synchronization with, the synchronization signal Tin, the controller 20 may output a control signal to each circuit in the driver 30. The synchronization signal may be inputted from the outside, for example.

Figure 3:
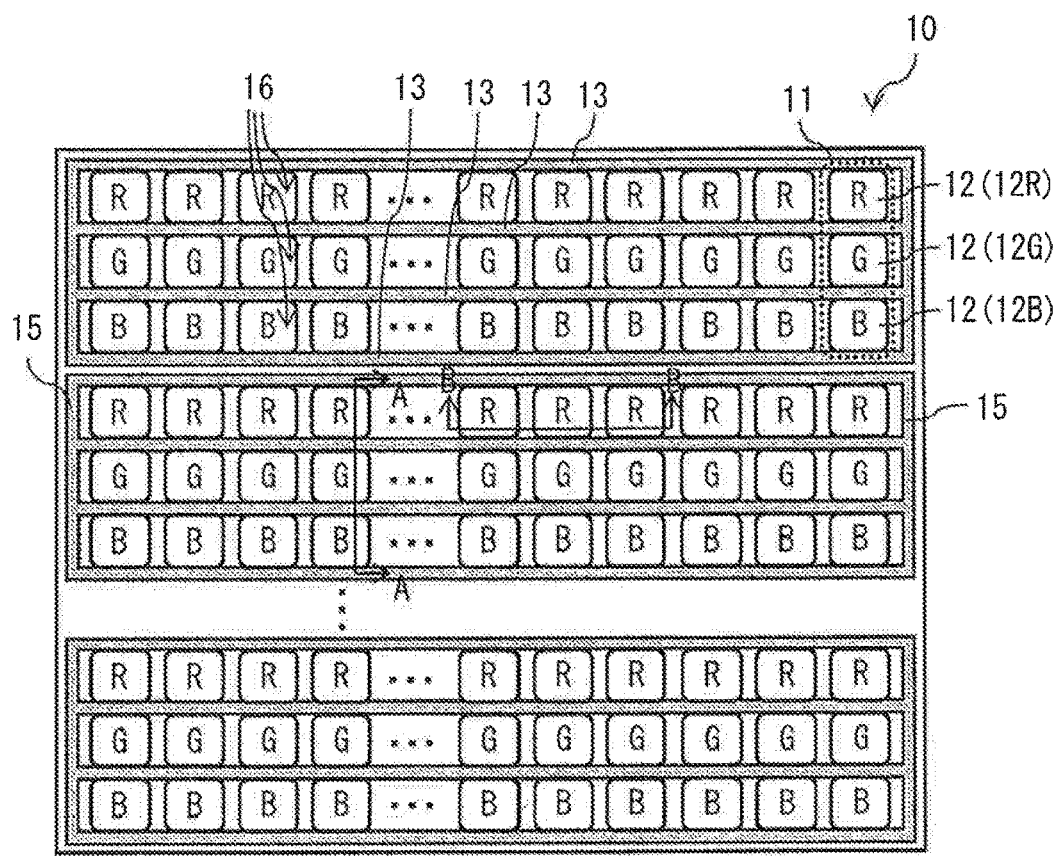
FIG. 3 illustrates a schematic configuration example of the organic electroluminescent panel of FIG. 1.
Figure 4:
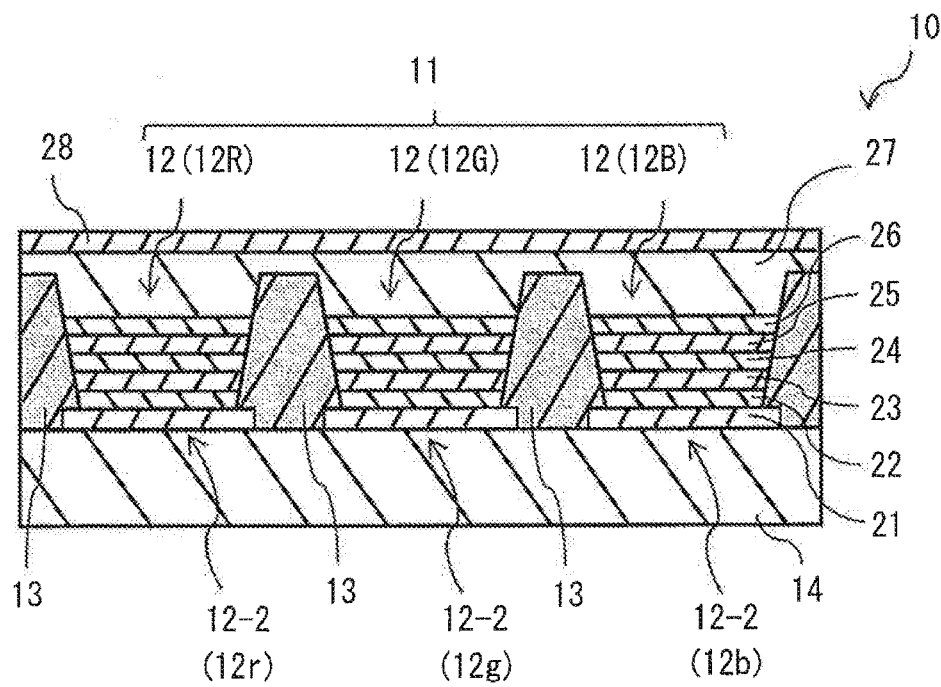
FIG. 4 illustrates a cross-sectional configuration example taken along the line A-A of the organic electroluminescent panel of FIG. 3.
Figure 5:
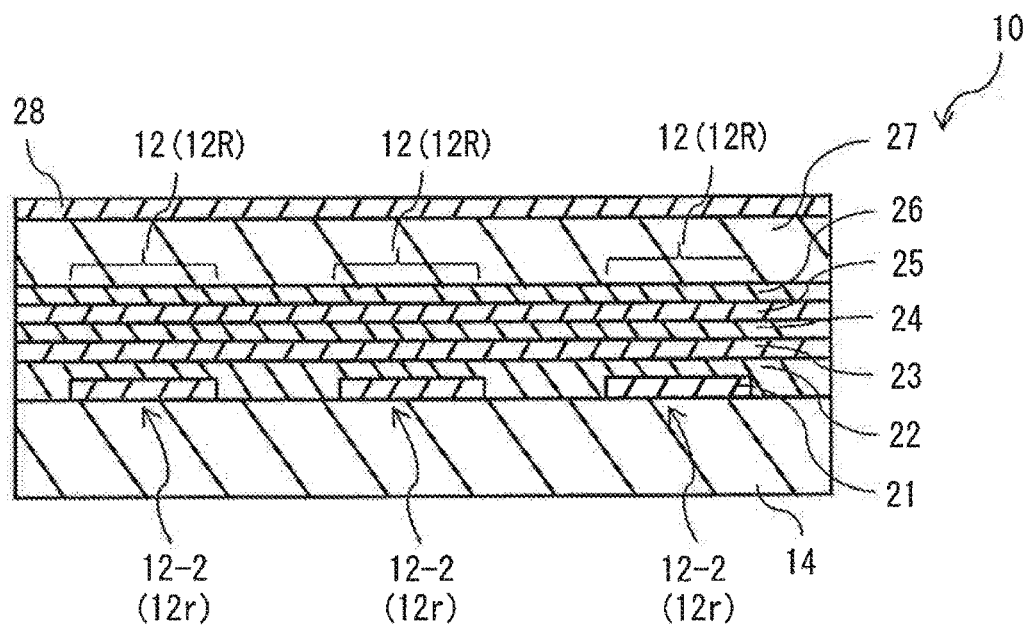
FIG. 5 illustrates a cross-sectional configuration example taken along the line B-B of the organic electroluminescent panel of FIG. 3.
Figure 6:
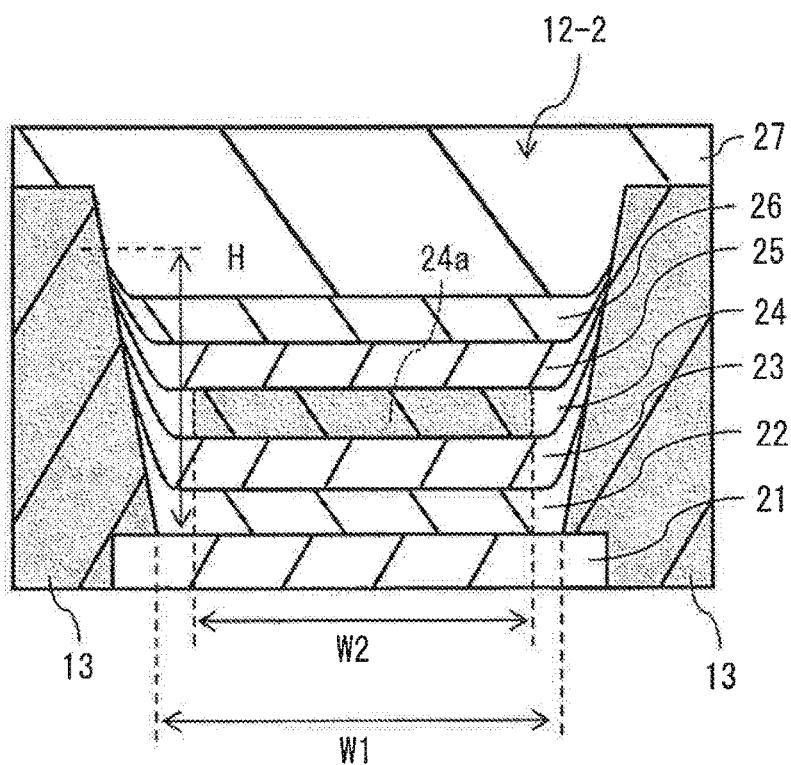
FIG. 6 illustrates an enlarged cross-sectional configuration example of the organic electroluminescent element of FIG. 4.

Next, the organic electroluminescent element 12-2 is described with reference to FIG. 3 to FIG. 6. FIG. 3 illustrates a schematic configuration example of the organic electroluminescent panel 10. FIG. 4 illustrates a cross-sectional configuration example taken along the line A-A of the organic electroluminescent panel 10 in FIG. 3. FIG. 5 illustrates a cross-sectional configuration example taken along the line B-B of the organic electroluminescent panel 10 in FIG. 3. FIG. 6 illustrates an enlarged cross-sectional configuration example of the organic electroluminescent element 12-2 in FIG. 4.

The organic electroluminescent panel 10 may have the plurality of pixels 11 arranged in matrix. As described above, each of the pixels 11 may include the subpixel 12 (12R) that emits red light, the subpixel 12 (12G) that emits green light, and the subpixel 12 (12B) that emits blue light, for example. The subpixel 12R may include the organic electroluminescent element 12-2 (12r) that emits red light. The subpixel 12G may include the organic electroluminescent element 12-2 (12g) that emits green light. The subpixel 12B may include the organic electroluminescent element 12-2 (12b) that emits blue light. The subpixels 12R, 12G, and 12B may be arranged in stripes, for example. For example, in each of the pixels 11, the subpixels 12R, 12G, and 12B may be disposed in the column direction. Furthermore, in each pixel row, the plurality of subpixels 12 that emit pieces of light of the same color may be disposed in the row direction, for example.

The organic electroluminescent panel 10 may have, on a substrate 14, a plurality of line banks 13 extending in the row direction. The plurality of line banks 13 may define the subpixels 12 in each of the pixels 11. The organic electroluminescent panel 10 may further have a plurality of banks 15 on the substrate 14. The plurality of banks 15 may have ends of the plurality of line banks 13 attached to each other. Each of the banks 15 may extend in the column direction. The substrate 14 may include a base member and a wiring layer. The base member may support, without limitation, each of the organic electroluminescent elements 12-2 and each of the line banks 13, for example. The wiring layer may be provided on the base member. The substrate 14 may include, without limitation, alkali-free glass, soda glass, non-fluorescent glass, phosphate glass, boric acid glass, or quartz, for example. The base member in the substrate 14 may include acrylic-based resin, styrene-based resin, polycarbonate-based resin, epoxy-based resin, polyethylene, polyester, silicone-based resin, or alumina for example. The wiring layer in the substrate 14 may include the pixel circuit 12-1 of each of the pixels 11, for example.

The line banks 13 and the banks 15 may include an insulating organic material, for example. The insulating organic material may include but not limited to acrylic-based resin, polyimide-based resin, or novolac-based phenolic resin. The line banks 13 and the banks 15 may include, for example, insulating resin that is heat-resistant and resistant to a solvent. The line banks 13 and the banks 15 may be formed by processing, for example, insulating resin into a predetermined pattern through photolithography and development. A cross-sectional shape of the line bank 13 may be of a forward taper type as illustrated in FIG. 4 or of an inverse taper type in which the bottom of the cross-sectional shape is narrower than the top of the cross-sectional shape.

A region surrounded by two of the line banks 13 that are mutually parallel and adjacent to each other and by the banks 15 at both ends may be a groove 16. In each of the subpixels 12, one of the organic electroluminescent elements 12-2 may be disposed in a gap of the two line banks 13 that are mutually parallel and adjacent to each other. For example, in each of the subpixels 12, one of the organic electroluminescent elements 12-2 may be disposed in the groove 16. A width of a bottom surface of the gap between the two line banks 13 that are parallel and adjacent to each other (an aperture width W1 of the groove 16) may be, for example, in a range from 10 μm to 100 μm. The aperture width W1 may have, for example, such a size as to have the definition within a range from 80 ppi to 500 ppi when the subpixels 12 of RGB are arranged in stripes.

Each of the organic electroluminescent elements 12-2 may have, for example, the anode 21, a hole-injection layer 22, a hole-transport layer 23, an organic light-emitting layer 24, an electron-transport layer 25, an electron-injection layer 26, and a cathode 27 in this order from a side of the substrate 14. The hole-injection layer 22 may improve hole injection efficiency. The hole-transport layer 23 may transport, to the organic light-emitting layer 24, holes injected from the anode 21. The organic light-emitting layer 24 may emit electroluminescence light of a predetermined color through a recombination of electrons and holes. The electron-transport layer 25 may transport, to the organic light-emitting layer 24, electrons injected from the cathode 27. The electron-injection layer 26 may improve electron injection efficiency. The hole-injection layer 22, the electron-injection layer 26, or both may be omitted. Each of the organic electroluminescent elements 12-2 may further have any layer other than those mentioned above.

The anode 21 may be disposed on the substrate 14, for example. The anode 21 may be a transparent electrode having translucency, for which a transparent conductive film made of a transparent conductive material such as ITO (Indium Tin Oxide) or IZO (Indium Zinc Oxide) may be used. It should be noted that the anode 21 is not limited to the transparent electrode but may be made of, for example, aluminum (Al), silver (Ag), an alloy of aluminum or silver, or a reflective electrode having reflectivity. The anode 21 may be a laminate of the reflective electrode and the transparent electrode.

The hole-transport layer 23 may transport, to the organic light-emitting layer 24, the holes injected from the anode 21. The hole-transport layer 23 may be a coated film, for example. The hole-transport layer 23 may be provided by application and drying of a solution a solute of which has an organic material, for example, as a main component. The organic material may have hole transportability. The organic material may be hereinafter referred to as a "hole transportability material 23M". The hole-transport layer 23 may include the hole transportability material 23M as a main component.

The hole transportability material 23M may be a basic ingredient, namely a material, of the hole-transport layer 23. The hole transportability material 23M may be for example but not limited to arylamine derivatives, triazole derivatives, oxadiazole derivatives, imidazole derivatives, polyarylalkane derivatives, pyrazoline derivatives and pyrazolne derivatives, phenylenediamine derivatives, amino-substituted chalcone derivatives, oxazole derivatives, styryl anthracene derivatives, fluorenone derivatives, hydrazone derivatives, stilbene derivatives, butadiene compounds, polystyrene derivatives, triphenylmethane derivatives, and tetraphenyl benzene derivatives, or a material including a combination thereof. The hole transportability material 23M may further have, in its molecular architecture, a soluble group and an insolubilizing group for solubility and insolubilization features, for example. The insolubilizing group may be, without limitation, a thermal dissociation soluble group, a crosslinking group, or a desorption protecting group. For example, the insulubilizing group may allow for the insulubilization as a result of a thermal treatment after a film formation.

The organic light-emitting layer 24 may emit light of a predetermined color through the recombination of holes and electrons. The organic light-emitting layer 24 may be a coated film. The organic light-emitting layer 24 may be provided by application and drying of a solution a solute of which has an organic material as a main component. The organic material may generate an exciter from the recombination of holes and electrons and emit light. The organic material may be hereinafter referred to as an "organic light-emitting material 24M". The organic light-emitting layer 24 may include the organic light-emitting material 24M as a main component. In the organic electroluminescent element 12r included in the subpixel 12R, the organic light-emitting material 24M may include an organic red light-emitting material. In the organic electroluminescent element 12g included in the subpixel 12G, the organic light-emitting material 24M may include an organic green light-emitting material. In the organic electroluminescent element 12b included in the subpixel 12B, the organic light-emitting material 24M may include an organic blue light-emitting material.

The organic light-emitting layer 24 may include a single-layered organic light-emitting layer or a plurality of organic light-emitting layers that are laminated, for example. In a case where the organic light-emitting layer 24 is the plurality of organic light-emitting layers in which the organic light-emitting layers 24 are laminated, the organic light-emitting layer 24 may be a laminate of the plurality of organic light-emitting layers main components of which are common to each other, for example. In such an example, each of the organic light-emitting layers may be a coated film. Each of the organic light-emitting layers may be provided by application and drying of a solution a solute of which has the organic light-emitting material 24M as a main component.

The organic light-emitting material 24M may be a basic ingredient, namely a material, of the organic light-emitting layer 24. While the organic light-emitting material 24M may be for example a single dopant material, the organic light-emitting material 24M may include a combination of a host material and a dopant material in one example. In other words, the organic light-emitting layer 24 may include the host material and the dopant material as the organic light-emitting material 24M. The host material may mainly serve to transport charges of electrons or holes, while the dopant material may serve to emit light. The host material and the dopant material may not be limited to only one kind, but may be a combination of two or more kinds. An amount of the dopant material may be equal to or greater than 0.01 weight percent and equal to or smaller than 30 weight percent with respect to the host material. In one example, the amount of the dopant material may be equal to or greater than 0.01 weight percent and equal to or smaller than 10 weight percent.

For example, amine compounds, condensed polyaromatic compounds, or hetero ring compounds may be used as the host material of the organic light-emitting layer 24. For example, monoamine derivatives, diamine derivatives, triamine derivatives, or tetraamine derivatives, without limitation, may be used as the amine compounds. For example, the condensed polyaromatic compounds may include but not limited to anthracene derivatives, naphthalene derivatives, naphthacene derivatives, phenanthrene derivatives, chrysene derivatives, fluoranthene derivatives, triphenylene derivatives, pentacene derivatives, or perylene derivatives. For example, the hetero ring compounds may include but not limited to carbazole derivatives, furan derivatives, pyridine derivatives, pyrimidine derivatives, triazine derivatives, imidazole derivatives, pyrazole derivatives, triazole derivatives, oxazole derivatives, oxadiazole derivatives, pyrrole derivatives, indole derivatives, azaindole derivatives, azacarbazole derivatives, pyrazoline derivatives, pyrazolone derivatives, or phthalocyanine derivatives.

In addition, for example, pyrene derivatives, fluoranthene derivatives, arylacetylene derivatives, fluorene derivatives, perylene derivatives, oxadiazole derivatives, anthracene derivatives, or chrysene derivatives may also be used as the dopant material for the organic light-emitting layer 24. A metal complex may also be used as the dopant material for the organic light-emitting layer 24. The metal complex may include a metal complex having a ligand and a metallic atom such as but not limited to iridium (Ir), platinum (Pt), osmium (Os), gold (Au), rhenium (Re), or ruthenium (Ru).

The electron-transport layer 25 may transport, to the organic light-emitting layer 24, electrons injected from the cathode 27. The electron-transport layer 25 may be a coated film, for example. The electron-transport layer 25 may include an organic material having electron transportability as a main component. The organic material may be hereinafter referred to as an "electron transportability material 25M".

The electron-transport layer 25 may be provided between the organic light-emitting layer 24 and the cathode 27, and may transport, to the organic light-emitting layer 24, electrons injected from the cathode 27. The electron transportability material 25M may be a basic ingredient, namely a material, of the electron-transport layer 25. The electron transportability material 25M may be aromatic hetero ring compounds, for example, that has one or more heteroatoms in a molecule. The aromatic hetero ring compounds may include a compound having a skeleton that includes but not limited to a pyridine ring, a pyrimidine ring, a triazine ring, a benzimidazole ring, a phenanthroline ring, or a quinazoline ring, for example. The electron-transport layer 25 may also include metal having the electron transportability. Inclusion of the metal having the electron transportability enables improved electron transportability of the electron-transport layer 25. For example, barium (Ba), lithium (Li), calcium (Ca), potassium (K), cesium (Cs), sodium (Na), or rubidium (Rb), without limitation, may be used as metal included in the electron-transport layer 25.

The cathode 27 may be, for example, a reflective electrode having light reflectivity, such as a metal electrode made of a metal material having reflectivity. Examples of a material of the cathode 27 may include aluminum (Al), magnesium (Mg), silver (Ag), aluminum-lithium alloy, or magnesium-silver alloy. It should be noted that the cathode 27 is not limited to the reflective electrode but may be a transparent electrode such as an ITO film as with the anode 21. In a case where the substrate 14 and the anode 21 have translucency and the cathode 27 has reflectivity, the organic electroluminescent element 12-2 may have a bottom emission structure that emits light from the substrate 14 side. In a case where the anode 21 has reflectivity and the cathode 27 has translucency, the organic electroluminescent element 12-2 has a top emission structure.

The organic electroluminescent panel 10 may further have a sealing layer 28 that seals each of the organic electroluminescent elements 12-2, for example. The sealing layer 28 may be provided in contact with an upper surface of the cathode 27 of each of the organic electroluminescent elements 12-2.

Figure 7:
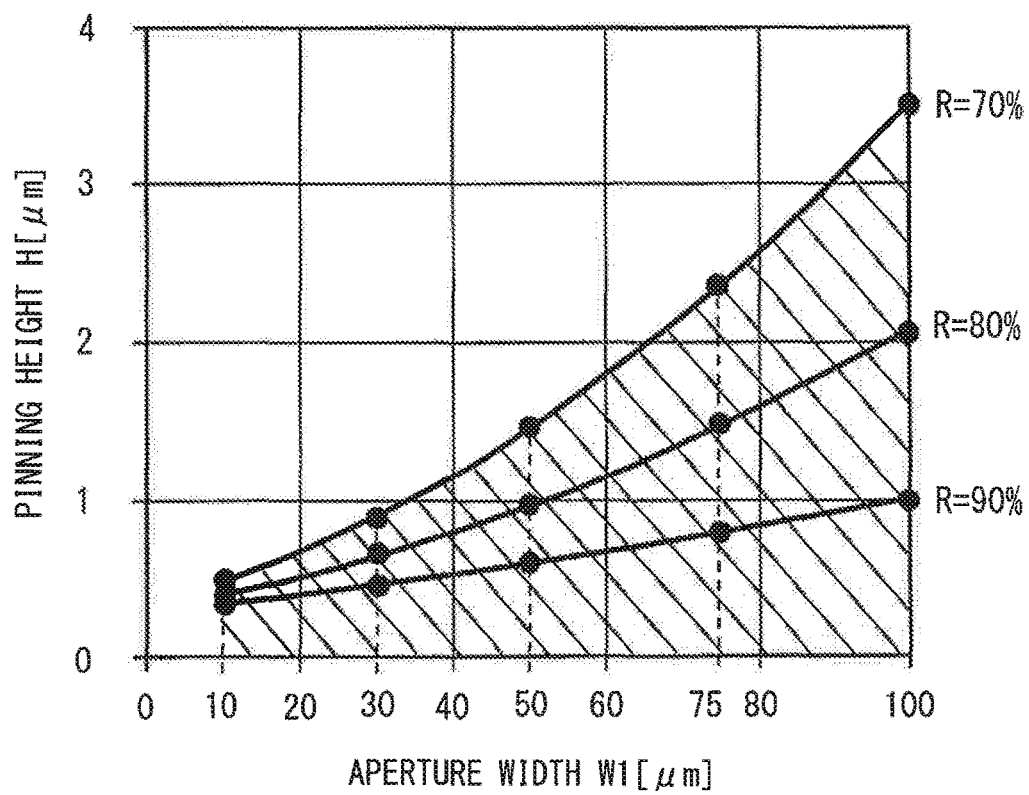
FIG. 7 represents a relationship between an aperture width and a pinning height at different aperture ratios.

Next, a meniscus formed on each organic electroluminescent element 12-2 is described. In a process of manufacturing each organic electroluminescent element 12-2, the meniscus is formed on a liquid surface of ink and the meniscus is also formed on a surface of a film formed after drying of the ink. Note that values of the viscosity and the surface tension of ink used in the process of manufacturing each organic electroluminescent element 12-2 are each within a range generally used for inkjetting. For ink used in the process of manufacturing each organic electroluminescent element 12-2, the viscosity may be within a range, for example, from 2 mPa·s to 20 mPa·s and the surface extension may be within a range, for example, from 25 mN/m to 45 mN/m. This causes the meniscus to be formed more or less on the surface of the hole-injection layer 22, the hole-transport layer 23, and the organic light-emitting layer 24 in each organic electroluminescent element 12-2. Under this situation, a part excluding a part that does not contribute to light emission due to effects of the meniscus (in other words, a part that contributes to light emission) in the organic light-emitting layer 24 is defined as a light-emitting region 24a. In addition, within the light-emitting region 24a, a width in a direction where the mutually-adjacent two line banks 13 are opposed to each other is defined as a light-emission width W2. In addition, a height of a pinning position, at which the surface of the organic light-emitting layer 24 and the line bank 13 are in contact with each other, from the bottom surface of the groove 16 is defined as a pinning height H. Note that the pinning position is equivalent to a boundary position, for example, between a lyophilic region and a hydrophobic region on the side of the line bank 13. In a case where the entire side of the line bank 13 serves as the lyophilic region and the upper face of the line bank 13 serves as the hydrophobic region, the pinning position may be on the end edge of the upper face of the line bank 13. For example, the anode 21 may be exposed from the bottom surface of the groove 16. In this case, x and y may satisfy a relational expression given below, where y denotes the pinning height H in μm and x denotes the aperture width W1 in μm. In this relational expression, x may take a value within a range from 10 μm to 100 μm. This relational expression may correspond to the location represented by oblique lines in FIG. 7.

$$y \leq 0.0001714x^2 + 0.0151429x + 0.2914286$$

Figures 8A, 8B:
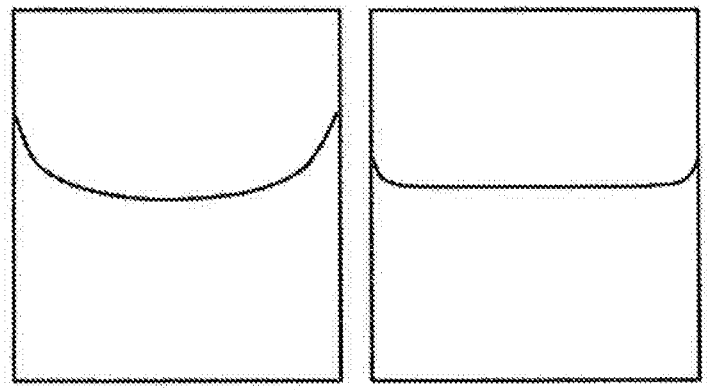
FIGS. 8A and 8B each illustrate a cross-sectional configuration example of an organic electroluminescent element at different aperture widths.

This relational expression may be obtained when the hole-injection layer 22, the hole-transport layer 23, and the organic light-emitting layer 24 are so formed that the aperture ratio R (=(W2/W1)×100) becomes 70% or greater with the aperture width W1 being set to 100 μm, 75 μm, 50 μm, 30 μm, and 10 μm. Note that FIGS. 8A and 8B each illustrate a state of meniscus formed on the surface of the organic light-emitting layer 24 when the hole-injection layer 22, the hole-transport layer 23, and the organic light-emitting layer 24 are so formed that the aperture ratio R becomes 70% with the aperture width W1 being 50 μm. It is to be also note that FIG. 8A illustrates a result according to a comparative example and FIG. 8B illustrates a result according to the present embodiment. In the comparative example, x and y do not satisfy the above relational expression. It is appreciated that the present embodiment is able to achieve a larger flat region (in other words, a region that contributes to light emission) as compared with the comparative example.

In an example embodiment, x and y may satisfy a relational expression given below. In this case, the aperture ratio R becomes 80% or greater.

$$y \leq 0.0000762x^2 + 0.0100952x + 0.2914286$$

In an example embodiment, x and y may satisfy a relational expression given below. In this case, the aperture ratio R becomes 90% or greater.

$$y \leq 0.0000190x^2 + 0.0050476x + 0.2914286$$

[Manufacturing Method]

Figure 9:
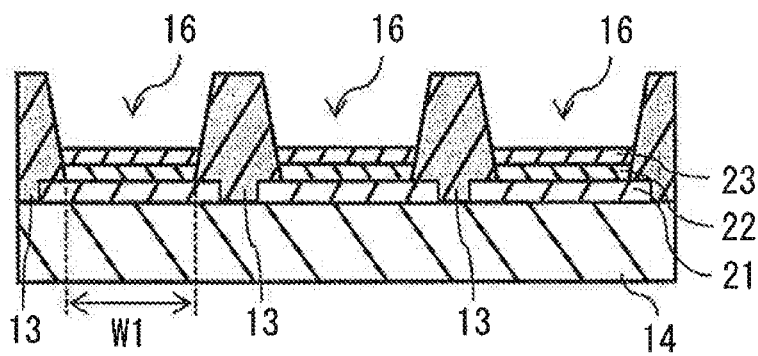
FIG. 9 illustrates an example of a manufacturing process of the organic electroluminescent panel of FIG. 4.
Figure 10:
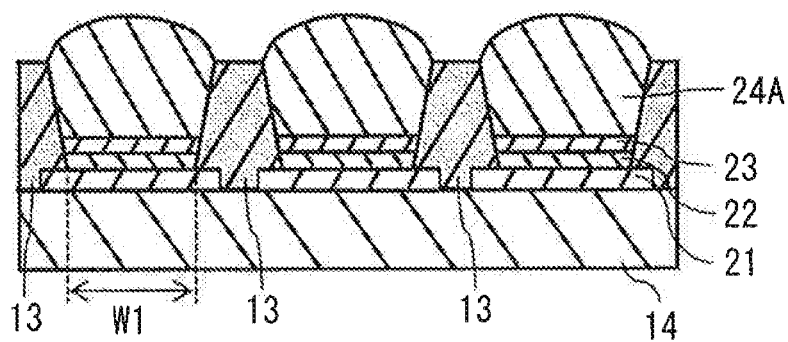
FIG. 10 illustrates an example of the manufacturing process following FIG. 9.
Figure 11:
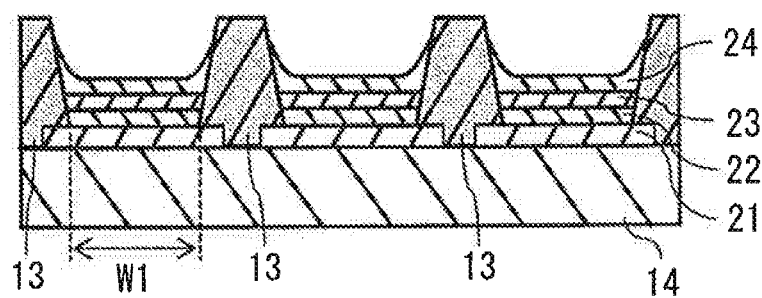
FIG. 11 illustrates an example of the manufacturing process following FIG. 10.

Next, a method of manufacturing the organic electroluminescent panel 10 is described. FIG. 9 to FIG. 11 each illustrate an example of the manufacturing process of the organic electroluminescent panel 10.

First, the anode 21 may be formed for each subpixel 12 on the substrate 14. Thereafter, the plurality of line banks 13 and the plurality of banks 15 may be so formed as to cover the end edge of each anode 21. This forms the groove 16 extending in the row direction. A gap between the two line banks 13 that are parallel and adjacent to each other (the aperture width W1 of the groove 16) may be set in accordance with the definition level required as the organic electroluminescent panel 10. In a case where the definition is set within a range from 80 ppi to 500 ppi with the subpixels 12 of RGB are arranged in stripes, the gap between the two line banks 13 that are parallel and adjacent to each other (the aperture width W1 of the groove 16) may be set within a range from 10 μm to 100 μm.

Thereafter, the hole-injection layer 22 and the hole-transport layer 23 may be formed by, for example, discharging ink droplets using an inkjet device and drying the discharged ink as illustrated in FIG. 9. Thereafter, a liquid-state organic material layer 24A may be formed by, for example, discharging ink droplets using the inkjet device as illustrated in FIG. 10. The liquid-state organic material layer 24A may be an organic material layer in a liquid state that includes the organic light-emitting material 24M as the main component of the solute. For example, first, the groove 16 may be coated with the liquid-state organic material layer 24A, following which the solvent included in the liquid-state organic material layer 24A may be vaporized by applying the drying process to the liquid-state organic material layer 24A. As a result, the organic light-emitting layer 24 may be formed as illustrated in FIG. 11.

Thereafter, the electron-transport layer 25 and the electron-injection layer 26 may be formed by, for example, discharging ink droplets using the inkjet device and drying the discharged ink. Thereafter, the cathode 27 and the sealing layer 28 may be formed on the electron-injection layer 26 in this order. In this manner, the organic electroluminescent panel 10 having the organic electroluminescent element 12-2 in each subpixel 12 may be manufactured.

[Effects]

Next, some effects of the organic electroluminescent panel 10 and the organic electroluminescent unit 1 provided with the same according to the present embodiment are described.

There is known a method of manufacturing an organic electroluminescent panel by forming an organic electroluminescent element for each pixel with use of an ink jet device. A recent increase in definition has brought a reduction in pixel size and a reduction of a liquid amount to be retained per unit area. From the standpoint of solubility or a printable physical property such as viscosity, however, it is difficult to excessively increase an ink concentration. For this reason, it can be considered to ensure the wet-spreading property of ink by, for example, making the side of a bank that defines each pixel lyophilic even when the liquid retention amount is small.

In a case where a side of a bank is made lyophilic, however, a meniscus is formed on an ink surface in a process of drying ink. The meniscus is also formed on a surface of a film formed after the drying of the ink. This makes a bank vicinity extremely thick in the thus-formed film, resulting in a phenomenon in which a center part of a pixel emits light strongly. As a result, a part that is usable as a light-emitting part is reduced.

In contrast, in one embodiment, the height y of the pinning position, at which the surface of the organic light-emitting layer 24 and the line bank 13 are in contact with each other, from the bottom surface of the groove 16 and the width x of the bottom surface of the groove 16 satisfy any of the relational expressions described above. Thus, the percentage of the part that is unusable as the light-emitting part of the organic light-emitting layer is reduced as compared with an existing organic electroluminescent panel. Consequently, it is possible to suppress the reduction of the usable part as the light-emitting part of the organic light-emitting layer.

In addition, in one embodiment, the aperture width W1 may be 100 µm or less. Thus, the percentage of the part that is unusable as the light-emitting part of the organic light-emitting layer is reduced as compared with an existing organic electroluminescent panel. Consequently, it is possible to suppress the reduction of the usable part as the light-emitting part of the organic light-emitting layer. For example, in one embodiment, the aperture width W1 may be 50 µm or less. This allows the percentage of the part that is unusable as the light-emitting part of the organic light-emitting layer is reduced significantly as compared with an existing organic electroluminescent panel. Consequently, it is possible to suppress the reduction of the usable part as the light-emitting part of the organic light-emitting layer.

In addition, in one embodiment, the aperture width W1 may be 10 µm or greater. Thus, the percentage of the part that is unusable as the light-emitting part of the organic light-emitting layer is reduced as compared with an existing organic electroluminescent panel. Consequently, it is possible to suppress the reduction of the usable part as the light-emitting part of the organic light-emitting layer.

In addition, in one embodiment, the anode 21 may be exposed from the bottom surface of the groove 16. This allows the entire bottom of the groove 16 to be used as the light-emitting part.

Although the disclosure has been described by referring to some embodiments, it is not limited thereto but various modifications are possible. For example, in some embodiments described above, the plurality of line banks 13 and the plurality of banks 15 are provided on the substrate 14. Alternatively, one pixel bank may be provided for each of the subpixels 12.

Note that effects described herein are merely illustrative. Effects of the disclosure are not intended to be limited to effects which were described herein. The disclosure may have other effects than those described herein.

It is possible to achieve the following configurations from the disclosure.

(1) An organic electroluminescent panel including:
a plurality of pixels each including a plurality of subpixels, the subpixels each including an organic electroluminescent element, the organic electroluminescent element including a first electrode, a second electrode, and an organic material layer that is provided between the first electrode and the second electrode; and
a plurality of banks that define each of the subpixels in each of the pixels,
the organic electroluminescent element in each of the subpixels being provided in a gap between adjacent two of the plurality of banks, and
the following relational expression being satisfied:

$$y \le 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

(2) The organic electroluminescent panel according to (1), in which the following relational expression is satisfied:

$$y \le 0.0000762x^2 + 0.0100952x + 0.2914286$$

where y denotes the height and x denotes the width.

(3) The organic electroluminescent panel according to (1), in which the following relational expression is satisfied:

$$y \le 0.0000190x^2 + 0.0050476x + 0.2914286$$

where y denotes the height and x denotes the width.

(4) The organic electroluminescent panel according to any one of (1) to (3), in which the width x is 100 µm or less.

(5) The organic electroluminescent panel according to any one of (1) to (3), in which the width x is 50 µm or less.

(6) The organic electroluminescent panel according to (4) or (5), in which the width x is 10 µm or greater.

(7) The organic electroluminescent panel according to any one of (1) to (6), in which the first electrode is exposed from the bottom surface.

(8) A luminescent unit including:
an organic electroluminescent panel; and
a driver,
the organic electroluminescent panel including
a plurality of pixels driven by the driver and each including a plurality of subpixels, the subpixels each including an organic electroluminescent element, the organic electroluminescent element including a first electrode, a second electrode, and an organic material layer that is provided between the first electrode and the second electrode, and
a plurality of banks that define each of the subpixels in each of the pixels,
the organic electroluminescent element in each of the subpixels being provided in a gap between adjacent two of the plurality of banks, and
the following relational expression being satisfied:

$$y \le 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

In the organic electroluminescent panel and the luminescent unit according to the respective embodiment of the disclosure, the height y of the pinning position, at which the surface of the organic material layer and the bank are in contact with each other, from the bottom surface of the gap and the width x of the bottom surface of the gap satisfy the relational expression described above. This allows the percentage of the part that is unusable as the light-emitting part of the organic light-emitting layer is reduced as compared with an existing organic electroluminescent panel.

According to the organic electroluminescent panel and the luminescent unit of the respective embodiments of the disclosure, the percentage of the part that is unusable as the light-emitting part of the organic light-emitting layer is reduced as compared with an existing organic electroluminescent panel. Consequently, it is possible to suppress the reduction of the usable part as the light-emitting part of the organic light-emitting layer.

It should be noted that the effect of the disclosure is not limited to what is described here but may include any effect described herein.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent panel comprising:
a plurality of pixels each including a plurality of subpixels, the subpixels each including an organic electroluminescent element, the organic electroluminescent element including a first electrode, a second electrode, and an organic material layer that is provided between the first electrode and the second electrode; and
a plurality of banks that define each of the subpixels in each of the pixels,
the organic electroluminescent element in each of the subpixels being provided in a gap between adjacent two of the plurality of banks, and
the following relational expression being satisfied:

$$y \leq 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

2. The organic electroluminescent panel according to claim 1, wherein the following relational expression is satisfied:

$$y \leq 0.0000762x^2 + 0.0100952x + 0.2914286$$

where y denotes the height and x denotes the width.

3. The organic electroluminescent panel according to claim 1, wherein the following relational expression is satisfied:

$$y \leq 0.0000190x^2 + 0.0050476x + 0.2914286$$

where y denotes the height and x denotes the width.

4. The organic electroluminescent panel according to claim 1, wherein the width x is 100 µm or less.

5. The organic electroluminescent panel according to claim 1, wherein the width x is 50 µm or less.

6. The organic electroluminescent panel according to claim 4, wherein the width x is 10 µm or greater.

7. The organic electroluminescent panel according to claim 1, wherein the first electrode is exposed from the bottom surface.

8. A luminescent unit comprising:
an organic electroluminescent panel; and
a driver,
the organic electroluminescent panel including
a plurality of pixels driven by the driver and each including a plurality of subpixels, the subpixels each including an organic electroluminescent element, the organic electroluminescent element including a first electrode, a second electrode, and an organic material layer that is provided between the first electrode and the second electrode, and
a plurality of banks that define each of the subpixels in each of the pixels,
the organic electroluminescent element in each of the subpixels being provided in a gap between adjacent two of the plurality of banks, and
the following relational expression being satisfied:

$$y \leq 0.0001714x^2 + 0.0151429x + 0.2914286$$

where y denotes a height, from a bottom surface of the gap, of a pinning position at which a surface of the organic material layer and one of the banks are in contact with each other, and x denotes a width of the bottom surface of the gap.

* * * * *